United States Patent
Nesnidal

(10) Patent No.: US 9,927,480 B2
(45) Date of Patent: Mar. 27, 2018

(54) SYSTEM AND METHOD FOR PROBE HEATER HEALTH INDICATION

(71) Applicant: Rosemount Aerospace, Inc., Burnsville, MN (US)

(72) Inventor: Michael Paul Nesnidal, Shakopee, MN (US)

(73) Assignee: ROSEMOUNT AEROSPACE, INC., Burnsville, MN (US)

( * ) Notice: Subject to any disclaimer, the term of this patent is extended or adjusted under 35 U.S.C. 154(b) by 594 days.

(21) Appl. No.: 14/534,756

(22) Filed: Nov. 6, 2014

(65) Prior Publication Data

US 2016/0131691 A1   May 12, 2016

(51) Int. Cl.
| | | |
|---|---|---|
| G01P 5/165 | (2006.01) |
| G01R 31/02 | (2006.01) |
| H02H 5/04 | (2006.01) |
| H05B 3/34 | (2006.01) |
| H05B 1/02 | (2006.01) |
| H05B 3/56 | (2006.01) |
| B64D 15/12 | (2006.01) |

(52) U.S. Cl.
CPC ............ *G01R 31/021* (2013.01); *G01P 5/165* (2013.01); *H02H 5/043* (2013.01); *H05B 1/0227* (2013.01); *H05B 3/56* (2013.01); *B64D 15/12* (2013.01); *H05B 2203/014* (2013.01); *H05B 2203/035* (2013.01); *H05B 2214/02* (2013.01)

(58) Field of Classification Search
USPC ....................................................... 73/861.68
See application file for complete search history.

(56) References Cited

U.S. PATENT DOCUMENTS

| | | | | |
|---|---|---|---|---|
| 4,121,088 A * | 10/1978 | Doremus | ............... | B64D 15/16 219/201 |
| 4,453,159 A * | 6/1984 | Huff | ...................... | G01K 3/005 200/61.08 |
| 4,896,141 A * | 1/1990 | Farquhar | ................ | G08B 17/02 250/227.14 |
| 6,070,475 A * | 6/2000 | Muehlhauser | ............ | G01F 1/46 374/E13.006 |
| 6,512,444 B1 * | 1/2003 | Morris, Jr. | ............. | H02H 5/042 219/510 |
| 6,668,640 B1 | 12/2003 | Alwin et al. | | |
| 7,334,467 B1 | 2/2008 | DuPuis | | |

(Continued)

FOREIGN PATENT DOCUMENTS

| | | |
|---|---|---|
| EP | 0778000 | 6/1997 |
| EP | 1391736 | 2/2004 |
| EP | 1997731 | 3/2008 |

(Continued)

OTHER PUBLICATIONS

Extended European Search Report dated Mar. 22, 2016 in European Application No. 15193238.1.

*Primary Examiner* — Joseph M Pelham
(74) *Attorney, Agent, or Firm* — Snell & Wilmer, LLP

(57) ABSTRACT

A multi-function probe wire de-icing apparatus is described. The multi-function probe wire de-icing apparatus may include a multi-function probe wire, a main heater wire collocated with the multi-function probe wire, and a sacrificial wire deposed adjacent to the main heater wire. The sacrificial wire is configured to fail prior to the main heater wire failing.

13 Claims, 4 Drawing Sheets

(56) References Cited

U.S. PATENT DOCUMENTS

2008/0251509 A1\* 10/2008 Robst ................... H05B 1/0272
                                                                  219/488
2013/0134149 A1\* 5/2013 Weiss ....................... H05B 1/02
                                                                  219/481

FOREIGN PATENT DOCUMENTS

| EP | 2412952 | | 2/2012 | | |
|----|---------|---|--------|---|---|
| EP | 2587604 | | 5/2013 | | |
| GB | 1506629 | A \* | 4/1978 | ............. | C23F 13/02 |
| GB | 2209650 | | 5/1989 | | |
| WO | 8301138 | | 3/1983 | | |

\* cited by examiner

SYSTEM AND METHOD FOR PROBE HEATER HEALTH INDICATION

FIELD

The present disclosure relates to probes and accessory systems, and more particularly to systems and methods for assessing remaining useful life of probe heater elements.

BACKGROUND

Air data probes are important flight instruments. Integrated heater elements prevent ice buildup during cold operating environments. However, heater elements may suffer fatigue and thermo-mechanical degradation over time, depending on various operating parameters. Historically, these failures have been unpredictable, inconvenient, and result in unacceptable down time.

SUMMARY

According to various embodiments, a multi-function probe wire de-icing apparatus is disclosed herein. The multi-function probe wire de-icing apparatus may include a multi-function probe wire, a main heater wire collocated with the multi-function probe wire, and a sacrificial wire deposed adjacent to the main heater wire. The sacrificial wire is configured to fail prior to the main heater wire failing.

According to various embodiments, a system for determining main heater wire lifespan is described herein. The system may include a portion of a channel, a main heater wire deposed within the portion of the channel, and a sacrificial wire deposed within the portion of the channel. The sacrificial wire is configured to fail prior to the main heater wire failing.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

Figure 1A:
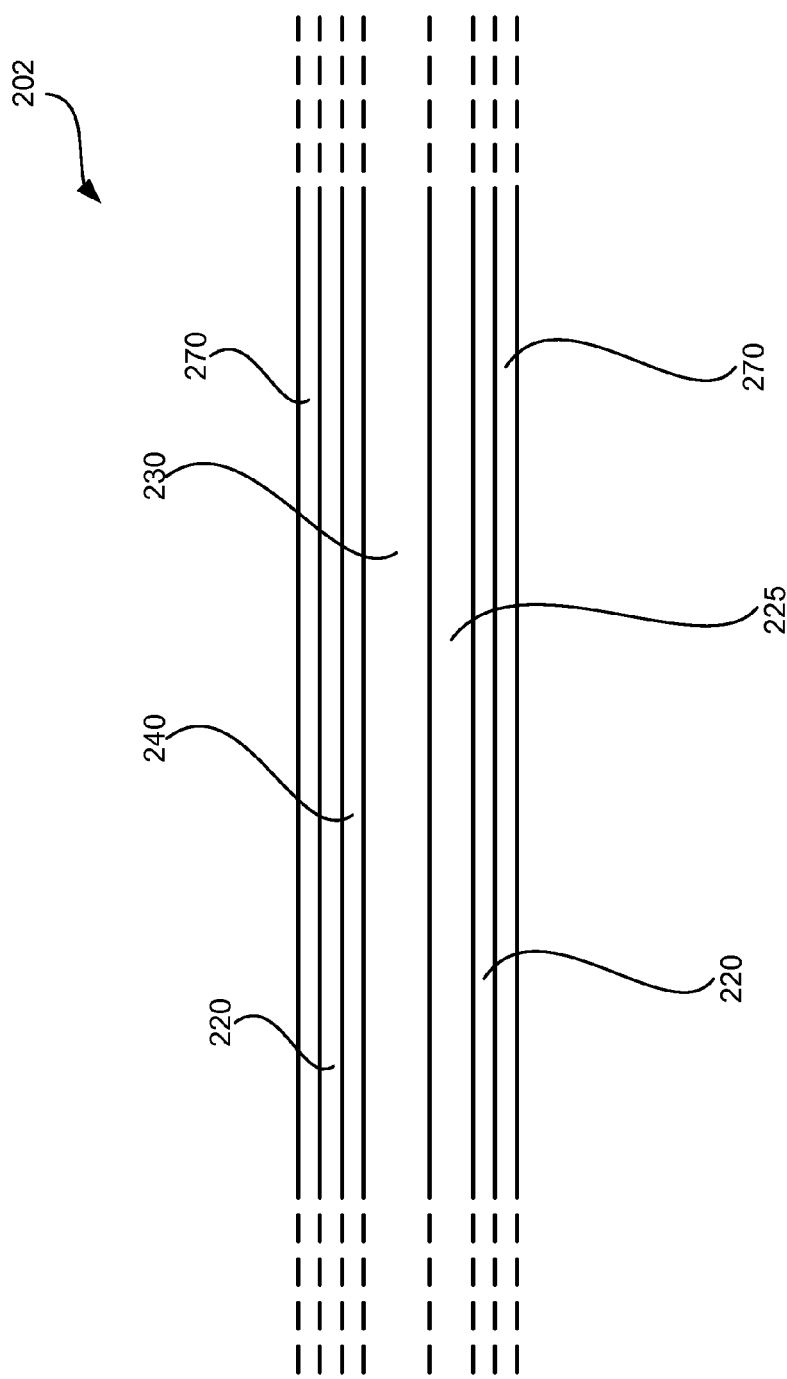
FIG. 1A is a top view diagram of a system configured for determining probe heater health in accordance with various embodiments.

The detailed description of exemplary embodiments herein makes reference to the accompanying drawings, which show exemplary embodiments by way of illustration and their best mode. While these exemplary embodiments are described in sufficient detail to enable those skilled in the art to practice the disclosure, it should be understood that other embodiments may be realized and that logical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step.

Many aircraft, including general aviation aircraft, unmanned air vehicles (UAVs), and experimental and research aircraft, use various air data sensors and signal processing circuits to determine various flight-related parameters. For example, many aircraft include a plurality of pressure sensors to sense at least static pressure ($P_s$) and total ($P_t$) or impact pressure ($Q_c$) during and/or prior to aircraft flight. The signal processing circuits, based on pressure signals supplied from the pressure sensors, generate and supply signals representative of various flight-related parameters. Such parameters may include, for example, the impact pressure, total pressure, static pressure, as well as aircraft speed (e.g., as measured in Mach (M)), calibrated airspeed (CAS), and barometric altitude. According to various embodiments, sensors and associated processing circuitry are packaged together into what may be referred to as an air data module (ADM).

Thus, the ADM may comprise one or more air data probes. These probes are sometimes referred to as electronic multi-function probes (MFPs) or air data sensing probes (ADSPs). For example a pressure probe may be a MFP. One type of electronic MFP is the SmartProbe™ sold by United Technologies Corporation. Multi-function probes typically include processing circuitry located proximate to the probe itself as part of its instrument package, and are therefore sometimes referred to as electronic multifunction probe air data computers.

As aircraft systems such as flight control systems and stall protection systems become more highly integrated, complex and automated, the integrity of the air data information that is used by these aircraft systems becomes increasingly more important. The quality of the multi-function probes' data may be impacted by various conditions. One of these conditions is ice buildup. In order to help reduce ice buildup and/or the likelihood of ice buildup, heat systems may be implemented near the multi-function probe.

In conventional systems, a heater wire may be a part of a heat system. The heater wire may span all or a portion of the wiring of a multi-function probe. Often, the heater wire may be collocated with the wiring of the multi-function probe. For instance, the heater wire may be braised to the multi-function probe wire and shrouded within a sheath of dielectric material. The dielectric material may be any suitable dielectric material such as a silicon dioxide sheath. The heater wire may fail over time, such as due to thermo mechanical stress during activation. This may result in downtime for the system to which the multi-function probe is coupled.

According to various embodiments and with reference to FIG. 1A, a system 202 is configured for determining heater probe wire status is generally depicted. Similar to the systems described above, a multi-function probe wire 230 may be located within a sheath 220 of dielectric material. Collocated within sheath 220 may be a main heater wire 225. Though depicted as being parallel to one another, it should be appreciated that the main heater wire may wrap around the diameter of the multi-function probe wire 230. Additionally, within the sheath 220 and substantially collocated with the main heater wire 225 is a sacrificial wire 240. Stated another way deposed adjacent to the main heater wire 225 may be a sacrificial wire 240. Though not shown, a second insulator may cover sacrificial wire 240 as desired. Sheath 220 may pass through a conduit and/or channel 270.

The failure rate of the main heater wire 225 may be known based on operating parameters and main heater wire 225 design choices. The operating parameters of the main heater wire 225 may be monitored over the operational life of the main heater wire 225. A threshold of time where the main heater wire 225 is likely to fail may be established. Sacrificial wire 240 may be configured such that it fails when the threshold is reached. In this way, sacrificial wire 240 may provide an indication that the main heater wire 225 should be replaced within a predetermined amount of use cycles and/or operating cycles. In this way, the system to which the multi-function probe wire 230 is coupled may continue to be utilized without adverse effects and/or downtime to repair. The system may be later be safely taken off line and repaired.

Sacrificial wire 240 may be made from any desired materials. For instance, sacrificial wire 240 may be made from a material known to degrade, such as due to thermo-mechanical stress, faster than the material of main heater wire 225. Often it may be desired to make sacrificial wire 240 from substantially the same materials as main heater wire 225. In the case of a substantially constant diameter wire, sacrificial wire 240 may have a smaller diameter as compared with the diameter of the main heater wire 225. Sacrificial wire 240 may have a larger diameter as compare with the diameter of the main heater wire 225, so long as sacrificial wire 240 is configured to fail prior to main heater wire 225 in this configuration. A failure in this context may refer to the loss of reliable electrical conductivity.

According to various embodiments, the main heater wire 225 may be determined to fail in a predetermined number of operating cycles in response to a condition that caused the sacrificial wire to fail.

According to various embodiments, sacrificial wire 240 may provide heating to assist with protecting ice from forming on portions of multi-function probe wire 230. For instance, sacrificial wire 240 may provide redundant de-icing assistance to the multi-function probe wire 230. Proper thermal management may be achieved based on a built-in heater controller.

According to various embodiments, sacrificial wire 240 may be designed such that it does not provide heating to assist with protecting ice from forming on portions of multi-function probe wire 230. Stated another way, the sacrificial wire 240 may be configured to indicate main heater wire 225 lifespan and not perform a secondary function (e.g., heating). The condition of sacrificial wire 240 may be monitored. For instance, sacrificial wire 240 may be monitored by a controller. A current may pass through sacrificial wire 240. In response to a ceasing of current flow and/or decreasing of current flow to unexpected levels, action may be taken with respect to the main heater wire 225 within a predetermined number of operational cycles of the system. For instance, an unexpected open sacrificial wire 240 circuit may indicate that the main heater wire 225 is likely to fail within a predetermined number of operational cycles, such as between about 10 and about 100 operational cycles, between about 50 and about 100 operational cycles and/or between about 1 and about 200 operational cycles.

According to various embodiments, determining the remaining life of the main heater wire 225 over the entire lifespan of the main heater wire 225 may be difficult to predict with accuracy. However, it may be known that after certain conditions occur in operation a failure of the main heater wire 225 may occur shortly. The failure of sacrificial wire 240 may indicate that these certain conditions have occurred. In this case, it may be desirable to replace the main heater wire 225 soon after and in response to the failure of the sacrificial wire 240. As used herein, "soon after" may refer to a predetermined number of operational cycles, such as between about 10 and about 100 operational cycles, between about 50 and about 100 operational cycles and/or between about 1 and about 200 operational cycles.

Figure 1B:
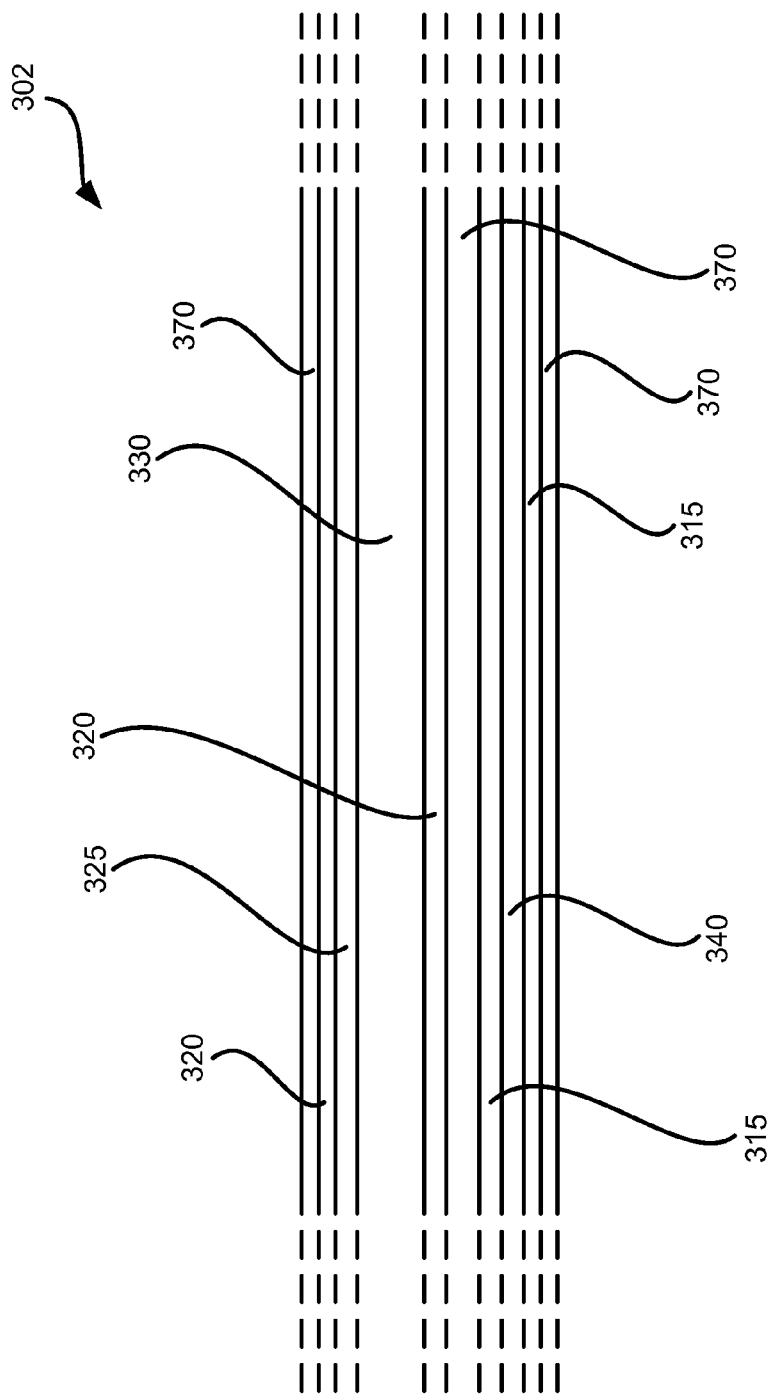
FIG. 1B is a top view diagram of a system configured for determining probe heater health in accordance with various embodiments.
Figure 3:
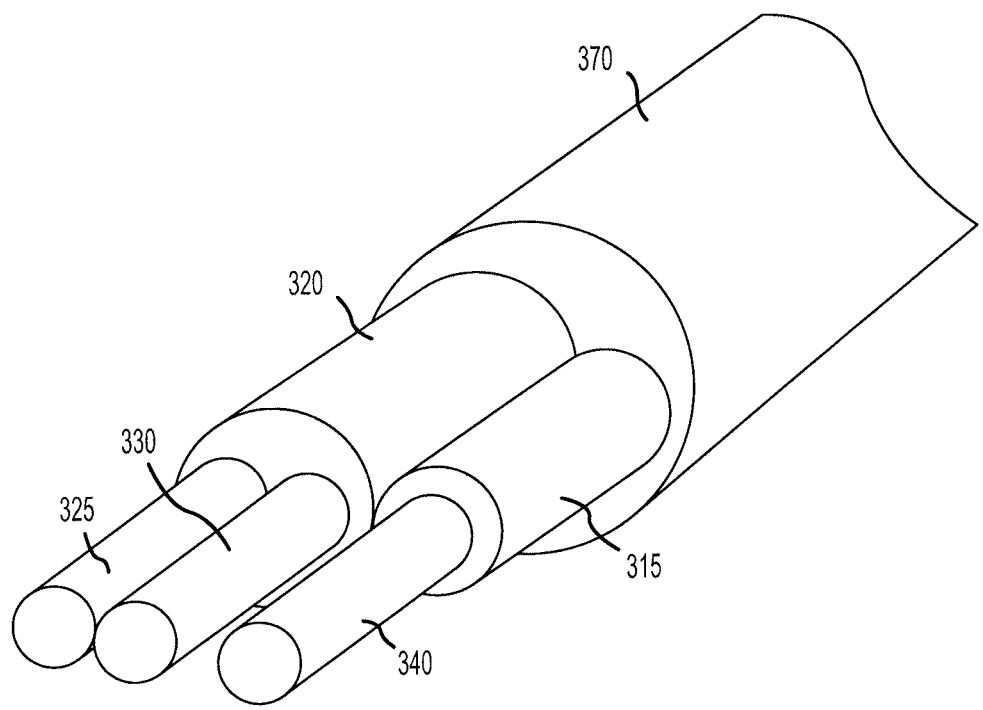
FIG. 3 is an isometric view of the system of FIG. 1B in accordance with various embodiments.

According to various embodiments, and with reference to FIGS. 1B and 3, a system 302 configured for determining heater probe wire heath is depicted. Similar to system 202 described above, a multi-function probe wire 330 may be located within a first sheath 320 of dielectric material. Collocated within the first sheath 320 may be a main heater wire 325. In a separate sheath of dielectric material, such as second sheath 315 a sacrificial wire 340 may be positioned. First sheath 320 and second sheath 315 may be positioned within and pass through a conduit and/or channel 370. According to various embodiments, first sheath 320 and second sheath 315 and/or multi-function probe wire 330 and main heater wire 325 may be positioned in separate conduits and/or channels. These channels may be located in close proximity. For instance, the channels comprising the sacrificial wire 340 and the channel comprising the main heater wire 325 may be deposed adjacent to one another. Second sheath 315 and first sheath 320 may be made from the same materials. Second sheath 315 may be thinner and/or thicker than first sheath 320 and configured to promote the failure of sacrificial wire 340 prior to main heater wire 325.

Figure 2:
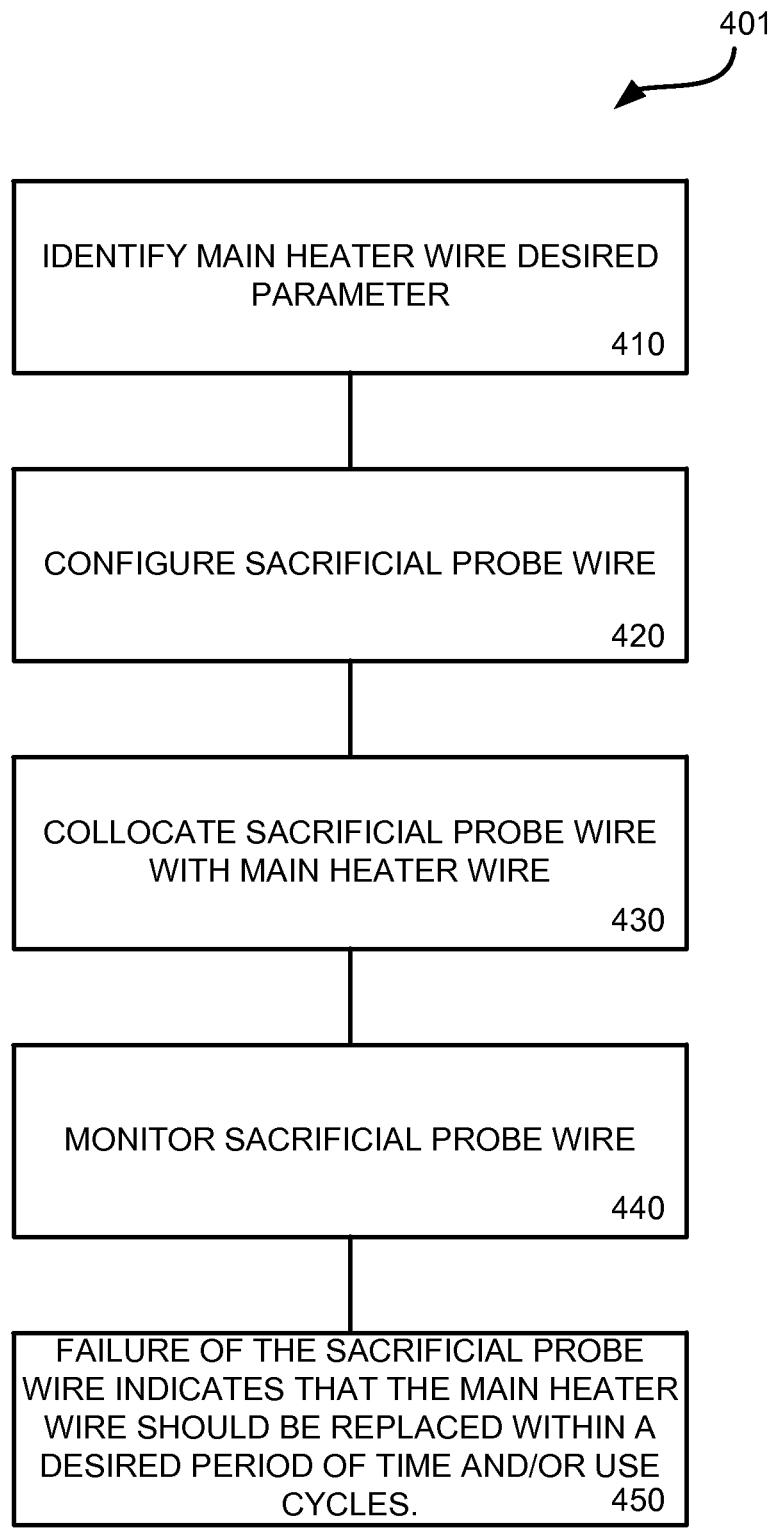
FIG. 2 is an exemplary flow diagram of a system and method for determining probe heater health in accordance with various embodiments.

According to various embodiments and with reference to FIG. 2, a method 401 of manufacture and use of an apparatus configured for determining probe heater status is depicted. Initially, a parameter of the main heater wire 225 may be determined (step 410). Typical parameters measured may include heating element impedance (including magnitude and phase, parallel capacitance and resistance, series inductance, resistance and Q-factor) and an in-rush current. For instance, a threshold associated with the desired parameter may be a diameter of the main heater wire 225 associated with unacceptable micro cracking through the main heater wire. Over time, micro cracking may occur in the main heater wire 225. Similarly, micro cracks may form in the sacrificial wire 240. The sacrificial wire 240 may comprise a smaller diameter than the main heater wire 225. The sacrificial wire 240 may be made from the same materials in the same process as the main heater wire 225. Stated another way, the sacrificial wire 240 may be configured based on the desired parameter (step 420). The sacrificial wire 240 and the main heater wire 225 may be collocated with a portion of a channel (step 430). The micro cracks may propagate through the sacrificial wire 240 faster than through the main heater wire 225. Sacrificial wire 240 may be monitored by a controller (step 440). Failure of the sacrificial wire 240 may indicate that replacement of the main heater wire 225 should occur soon (e.g., within a predetermined number of use cycles and/or time (step 450).

The multi-function probe wire 230 and respective channel 370 may be located on any desired system and/or apparatus. The multi-function probe wire 230 and respective channel 370 may be located on a vehicle, such as in an aerostructure of an aircraft.

Though the systems described above have been described with respect to a multi-function probe wire 230, the systems described herein are applicable other systems which utilize embedded heater. For instance, ice detectors, air temperature probes, air data probes, and other systems may utilize the systems described herein.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Different cross-hatching is used throughout the figures to denote different parts but not necessarily to denote the same or different materials.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A system for determining a main heater wire lifespan comprising:
   a portion of a channel;
   a main heater wire disposed within the portion of the channel; and
   a sacrificial wire disposed within the portion of the channel, comprising a same material as the main heater wire, and having a smaller diameter than the main heater wire, wherein the sacrificial wire is configured to have a cessation of current flow prior to the main heater wire having a cessation of current flow.

2. The system for determining main heater wire lifespan of claim 1, wherein the main heater wire is collocated within a multi-function probe wire.

3. The system for determining main heater wire lifespan of claim 1, wherein the main heater wire and the sacrificial wire are shrouded within a length of dielectric material.

4. The system for determining main heater wire lifespan of claim 1, wherein the main heater wire is shrouded within a first length of dielectric material; and wherein the sacrificial wire is shrouded within a second length of dielectric material.

5. The system for determining main heater wire lifespan of claim 1, wherein the sacrificial wire having a cessation of current flow indicates replacement of the main heater wire should occur within a predetermined number of operational cycles.

6. The system for determining main heater wire lifespan of claim 1, wherein the sacrificial wire is configured to have a cessation of current flow in response to a threshold associated with a desired parameter being exceeded.

7. The system for determining main heater wire lifespan of claim 1, wherein the main heater wire is determined to have a cessation of current flow in a predetermined number of operating cycles in response to a condition that caused the sacrificial wire to have a cessation of current flow.

8. The system for determining main heater wire lifespan of claim 1, wherein the sacrificial wire having a cessation of current flow indicates the main heater may have a cessation of current flow within a predetermined threshold of time.

9. The system for determining main heater wire lifespan of claim 1, further comprising a controller configured to monitor an operational condition of the sacrificial wire.

10. The system for determining main heater wire lifespan of claim 1, wherein at least one of the sacrificial wire or the main heater wire are braised to a multi-function probe wire.

11. A multi-function probe wire de-icing apparatus comprising:
    a multi-function probe wire;
    a main heater wire collocated with the multi-function probe wire; and
    a sacrificial wire deposed adjacent to the main heater wire, comprising a same material as the main heater wire, and having a smaller diameter than the main heater wire, wherein the sacrificial wire is configured to have a cessation of current flow prior to the main heater wire having a cessation of current flow.

12. The multi-function probe wire de-icing apparatus of claim 11, wherein the main heater wire and the sacrificial wire are shrouded within a length of dielectric material.

13. The multi-function probe wire de-icing apparatus of claim 11, wherein the main heater wire is shrouded within a first length of dielectric material; and wherein the sacrificial wire is shrouded within a second length of dielectric material.

* * * * *